(12) United States Patent
Jiang

(10) Patent No.: US 9,043,495 B2
(45) Date of Patent: May 26, 2015

(54) METHOD AND APPARATUS FOR OBTAINING EQUIPMENT IDENTIFICATION INFORMATION

(71) Applicant: HUAWEI DEVICE CO., LTD., Shenzhen (CN)

(72) Inventor: Jianhui Jiang, Shanghai (CN)

(73) Assignee: HUAWEI DEVICE CO., LTD., Shenzhen (CN)

( * ) Notice: Subject to any disclaimer, the term of this patent is extended or adjusted under 35 U.S.C. 154(b) by 0 days.

(21) Appl. No.: 14/085,176

(22) Filed: Nov. 20, 2013

(65) Prior Publication Data

US 2014/0082223 A1  Mar. 20, 2014

Related U.S. Application Data

(63) Continuation of application No. PCT/CN2011/074895, filed on May 30, 2011.

(51) Int. Cl.
*G06F 13/38* (2006.01)
*G01R 31/36* (2006.01)
*G06F 13/10* (2006.01)

(52) U.S. Cl.
CPC .......... *G06F 13/385* (2013.01); *G01R 31/3682* (2013.01); *G06F 13/10* (2013.01)

(58) Field of Classification Search
CPC ..... G01R 31/3682; H02J 9/061; Y10S 320/19
See application file for complete search history.

(56) References Cited

U.S. PATENT DOCUMENTS

| 3,637,943 | A  | * | 1/1972 | Funke | 379/342 |
| 2002/0032055 | A1 | * | 3/2002 | Church et al. | 463/40 |
| 2002/0083613 | A1 | * | 7/2002 | Wells, Jr. | 33/784 |
| 2010/0090746 | A1 |   | 4/2010 | Nakada et al. | 327/365 |

FOREIGN PATENT DOCUMENTS

| CN | 101398459 A | 4/2009 |
| CN | 101667166 A | 3/2010 |
| CN | 101727188 A | 6/2010 |
| CN | 101727428 A | 6/2010 |
| CN | 101788609 A | 7/2010 |

OTHER PUBLICATIONS

International Search Report issued Mar. 15, 2012, in corresponding International Patent Application No. PCT/CN2011/074895.
(Continued)

*Primary Examiner* — Hyun Nam
(74) *Attorney, Agent, or Firm* — Staas & Halsey LLP

(57) ABSTRACT

Embodiments of the present invention relate to a method and an apparatus for obtaining equipment identification information, where the method includes: detecting, by using a first GPIO port, a first discharging duration for a capacitor to discharge through a resistor to be tested; detecting, by using a second GPIO port, a second discharging duration for the capacitor to discharge through a fixed value resistor; and obtaining a resistance of the resistor to be tested according to the first discharging duration, the second discharging duration, and a resistance of the fixed value resistor. The embodiments of the present invention are capable of increasing identification efficiency of the GPIO port.

18 Claims, 2 Drawing Sheets

(56) References Cited

OTHER PUBLICATIONS

Chinese Office Action issued Nov. 22, 2012, in corresponding Chinese Patent Application No. 201180000788.0.

* cited by examiner

METHOD AND APPARATUS FOR OBTAINING EQUIPMENT IDENTIFICATION INFORMATION

CROSS-REFERENCE TO RELATED APPLICATIONS

This application is a continuation of International Application No. PCT/CN2011/074895, filed on May 30, 2011, which is hereby incorporated by reference in its entirety.

TECHNICAL FIELD

Embodiments of the present invention relate to a communication technology, and in particular, to a method and an apparatus for obtaining equipment identification information.

BACKGROUND

Generally, hardware equipment (for example, a liquid crystal display screen, a camera, and a charger) of a same type may be produced by different manufacturers, or may further have different feature parameters; hardware equipment that is not completely same with each other differ in the use of an application program. Therefore, when an application program is set for each piece of hardware equipment, a corresponding application program needs to be set for the hardware equipment according to equipment identification information of the hardware equipment, for example, manufacturer information and feature parameter information.

In the prior art, a general purpose input output (General Purpose Input Output, GPIO for short) port may be used to identify an output level of hardware equipment. A GPIO port has only two states: a high level and a low level; therefore, one GPIO port may identify only two pieces of equipment identification information, that is, two GPIO ports may identify only four pieces of equipment identification information. By analogy, in the prior art, a fixed number of GPIO ports may identify only a limited number of pieces of equipment identification information, so as to limit the number of pieces of equipment identification information that a GPIO port may identify, thereby reducing identification efficiency of the GPIO port.

SUMMARY

Embodiments of the present invention provide a method and an apparatus for obtaining equipment identification information, so as to avoid a problem in the prior art that the number of pieces of equipment identification information that GPIO ports may identify is limited, which is caused by the fact that, a fixed number of GPIO ports may identify only a limited number of pieces of equipment identification information.

The embodiments of the present invention provide a method for obtaining equipment identification information, including:

detecting, by using a first general purpose input output GPIO port, a first discharging duration for a capacitor to discharge through a resistor to be tested, where the first GPIO port is connected to the capacitor through a fixed value resistor;

detecting, by using a second GPIO port, a second discharging duration for the capacitor to discharge through the fixed value resistor, where the second GPIO port is connected to the capacitor through the resistor to be tested;

obtaining a resistance of the resistor to be tested according to the first discharging duration, the second discharging duration, and a resistance of the fixed value resistor; and obtaining equipment identification information corresponding to the resistance of the resistor to be tested according to mapping between a resistance of a resistor to be tested and equipment identification information.

The embodiments of the present invention further provide an apparatus for obtaining equipment identification information, including:

a first detecting unit, configured to detect, by using a first general purpose input output GPIO port, a first discharging duration for a capacitor to discharge through a resistor to be tested, where the first GPIO port is connected to the capacitor through a fixed value resistor;

a second detecting unit, configured to detect, by using a second GPIO port, a second discharging duration for the capacitor to discharge through the fixed value resistor, where the second GPIO port is connected to the capacitor through the resistor to be tested;

a resistance obtaining unit, configured to obtain a resistance of the resistor to be tested according to the first discharging duration, the second discharging duration, and a resistance of the fixed value resistor; and an information obtaining unit, configured to obtain equipment identification information corresponding to the resistance of the resistor to be tested according to mapping between a resistance of a resistor to be tested and equipment identification information.

It can be known from the foregoing technical solution that, in the embodiments of the present invention, a resistance of a resistor to be tested is obtained according to a discharging duration for a capacitor to discharge through the resistor to be tested, a discharging duration for the capacitor to discharge through a fixed value resistor, and a resistance of the fixed value resistor, so that equipment identification information corresponding to the resistance of the resistor to be tested may be obtained according to mapping between a resistance of a resistor to be tested and equipment identification information, so as to avoid a problem in the prior art that the number of pieces of equipment identification information that GPIO ports may identify is limited, which is caused by the fact that, a fixed number of GPIO ports may identify only a limited number of pieces of equipment identification information, thereby increasing identification efficiency of the GPIO port.

BRIEF DESCRIPTION OF DRAWINGS

To illustrate the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the objectives, technical solutions, and advantages of the embodiments of the present invention more comprehensible, the following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
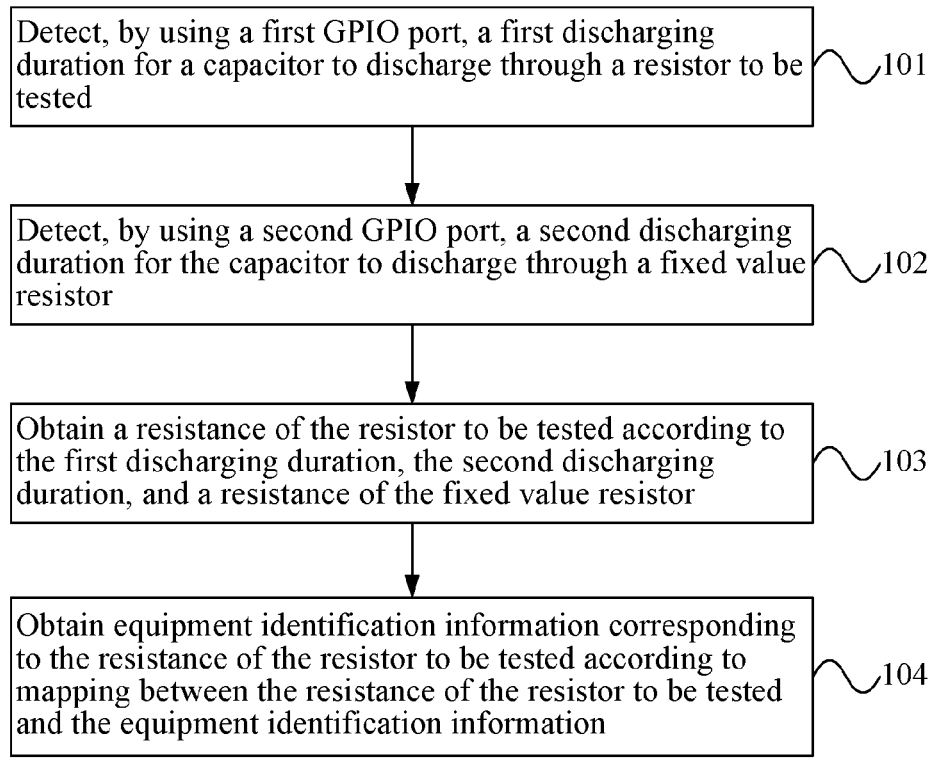
FIG. 1 is a schematic flowchart of a method for obtaining equipment identification information according to an embodiment of the present invention.
Figure 2:
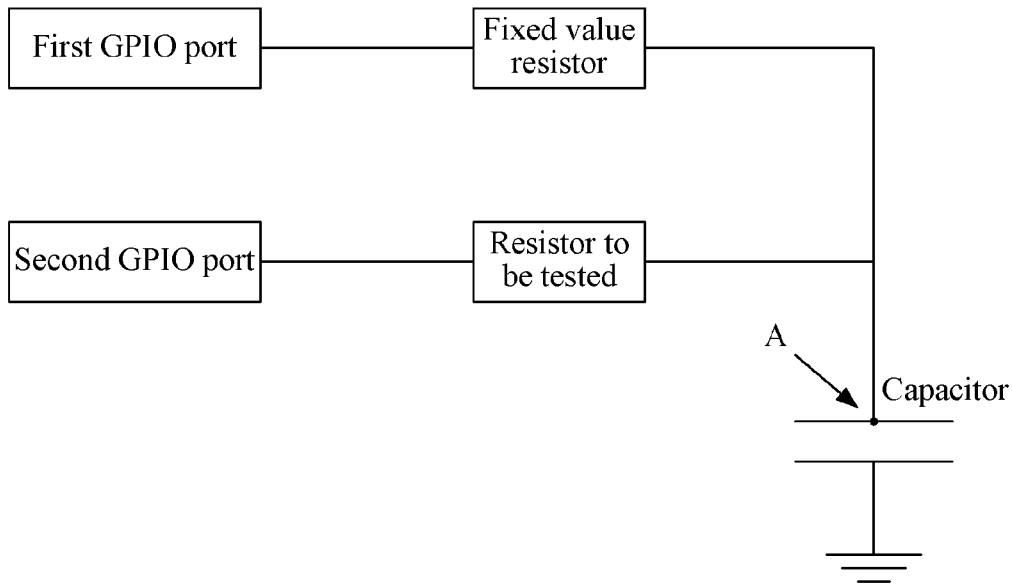
FIG. 2 is a schematic diagram of port connection in a method for obtaining equipment identification information according to an embodiment of the present invention.

FIG. 1 is a schematic flowchart of a method for obtaining equipment identification information according to an embodiment of the present invention, and FIG. 2 is a schematic diagram of port connection in a method for obtaining equipment identification information according to an embodiment of the present invention. As shown in FIG. 2, a first GPIO port is connected to a capacitor through a fixed value resistor; a second GPIO port is connected to the capacitor through a resistor to be tested. As shown in FIG. 1, the method for obtaining equipment identification information according to this embodiment may include the following steps:

101: Detect, by using the first GPIO port, a first discharging duration for the capacitor to discharge through the resistor to be tested.

Specifically, the first GPIO port may be set to an input state to detect a level of the capacitor, and the second GPIO port may be set to an output low level state, so that the capacitor discharges through the resistor to be tested, and a duration from a high level to a low level of the capacitor detected by the first GPIO port is used as the first discharging duration. For example, the first GPIO port is set to an input state to detect the level of point A. After the level of point A stabilizes at a high level, an interruption function of the first GPIO port may be started, and a counter may be started through software, so as to start to detect the level of point A; the second GPIO port is set to an output low level state, so that the capacitor may discharge through the resistor to be tested, and the duration from the high level to the low level of point A detected by the first GPIO port is used as the first discharging duration.

102: Detect, by using the second GPIO port, a second discharging duration for the capacitor to discharge through the fixed value resistor.

Specifically, the second GPIO port may be set to an input state to detect a level of the capacitor, and the first GPIO port may be set to an output low level state, so that the capacitor discharges through the fixed value resistor, and a duration from a high level to a low level of the capacitor detected by the second GPIO port is used as a second discharging duration. For example, the second GPIO port is set to an input state to detect the level of point A. After the level of point A stabilizes at a high level, an interruption function of the second GPIO port may be started, and a counter may be started through software, so as to start to detect the level of point A; the first GPIO port is set to an output low level state, so that the capacitor may discharge through the fixed value resistor; the duration from the high level to the low level of point A detected by the second GPIO port is used as the second discharging duration.

It should be noted that, there is no fixed sequence for performing steps 101 and 102.

It may be understood that, in both steps 101 and 102, the discharging duration of the capacitor is detected; therefore, before both steps 101 and 102, a charge process needs to be performed to charge the capacitor, so as to implement the detection of the discharging duration of the capacitor. As shown in FIG. 2, optionally, specifically the capacitor may be charged through the second GPIO port by using the resistor to be tested; for example, the second GPIO port is set to an output high level state, so as to charge the capacitor through the resistor to be tested. Optionally, specifically the capacitor may be further charged through the first GPIO port by using the fixed value resistor; for example, the first GPIO port is set to an output high level state, so as to charge the capacitor through the fixed value resistor.

103: Obtain a resistance of the resistor to be tested according to the first discharging duration, the second discharging duration, and a resistance of the fixed value resistor.

Specifically, the resistance of R1 may be calculated according to $R1=R2T1/T2$, where the R1 is the resistor to be tested; the R2 is the fixed value resistor; the T1 is the first discharging duration; and the T2 is the second discharging duration.

104: Obtain equipment identification (ID) information corresponding to the resistance of the resistor to be tested according to mapping between a resistance of a resistor to be tested and equipment identification information.

Furthermore, in the embodiment, before step 104, the mapping between a resistance of a resistor to be tested and equipment identification information may further be established. The mapping between a resistance of a resistor to be tested and equipment identification information may be shown in Table 1.

TABLE 1

Mapping between a resistance of a resistor to be tested and equipment identification information

| Resistance of a resistor to be tested | Equipment identification information |
|---|---|
| R11 | Equipment ID1 information |
| R12 | Equipment ID2 information |
| R13 | Equipment ID3 information |
| R14 | Equipment ID4 information |
| ... | ... |
| R1n | Equipment IDn information |

The equipment identification information may include but not limited to hardware equipment manufacturers (for example, digital cameras manufactured by different manufacturers) and feature parameters (for example, chargers with different charge currents).

In this embodiment, a resistance of a resistor to be tested is obtained according to a discharging duration for a capacitor to discharge through the resistor to be tested, a discharging duration for the capacitor to discharge through a fixed value resistor, and a resistance of the fixed value resistor, so that equipment identification information corresponding to the resistance of the resistor to be tested may be obtained according to mapping between a resistance of a resistor to be tested and equipment identification information, so as to avoid a problem in the prior art that the number of pieces of equipment identification information that GPIO ports may identify is limited, which is caused by the fact that, a fixed number of GPIO ports may identify only a limited number of pieces of equipment identification information, thereby increasing identification efficiency of the GPIO port.

It should be noted that, for the method embodiments, for brevity, each method embodiment is described as a combination of a series of actions; however, persons skilled in the art should know that, the present invention is not limited by the described action sequence, because some steps may be performed in another sequence or simultaneously according to the present invention. In addition, persons skilled in the art should also know that, all the embodiments described in the specification are exemplary embodiments, and the involved actions and modules are not necessarily required by the present invention.

In the foregoing embodiments, the description of each embodiment has different emphasis; for content that is not detailed in an embodiment, reference may be made to the related description of another embodiment.

Figure 3:
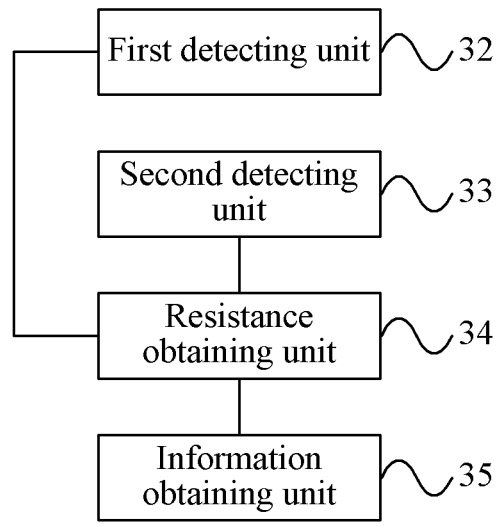
FIG. 3 is a schematic structural diagram of an apparatus for obtaining equipment identification information according to another embodiment of the present invention.

FIG. 3 is a schematic structural diagram of an apparatus for obtaining equipment identification information according to another embodiment of the present invention. As shown in FIG. 3, the apparatus for obtaining equipment identification information according to this embodiment may include a first detecting unit 32, a second detecting unit 33, a resistance obtaining unit 34, and an information obtaining unit 35. The first detecting unit 32 is configured to detect, by using a first GPIO port, a first discharging duration for a capacitor to discharge through a resistor to be tested, where the first GPIO port is connected to the capacitor through a fixed value resistor; the second detecting unit 33 is configured to detect, by using a second GPIO port, a second discharging duration for the capacitor to discharge through the fixed value resistor, where the second GPIO port is connected to the capacitor through the resistor to be tested; the resistance obtaining unit 34 is configured to obtain a resistance of the resistor to be tested according to the first discharging duration, the second discharging duration, and a resistance of the fixed value resistor; and the information obtaining unit 35 is configured to obtain equipment identification information corresponding to the resistance of the resistor to be tested according to mapping between a resistance of a resistor to be tested and equipment identification information.

The method in the embodiment corresponding to FIG. 1 may be implemented by the apparatus for obtaining equipment identification information provided by this embodiment.

Figure 4:
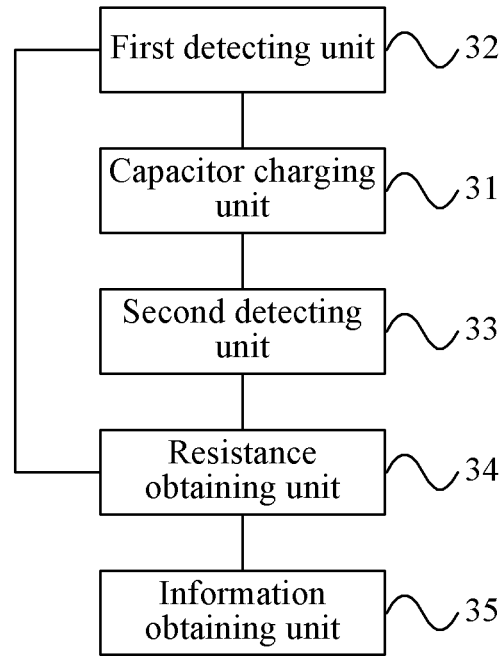
FIG. 4 is a schematic structural diagram of an apparatus for obtaining equipment identification information according to another embodiment of the present invention.

Furthermore, as shown in FIG. 4, the apparatus for obtaining equipment identification information in this embodiment may further include a capacitor charging unit 31, configured to charge a capacitor through a first GPIO port or a second GPIO port. Specifically, the capacitor charging unit 31 in this embodiment may specifically set the first GPIO port or the second GPIO port to an output high level state, so as to charge the capacitor through the first GPIO port or the second GPIO port.

Specifically, the first detecting unit 32 in this embodiment may specifically set the first GPIO port to an input state to detect a level of the capacitor, set the second GPIO port to an output low level state, so that the capacitor discharges through the resistor to be tested, and use a duration from a high level to a low level of the capacitor detected by the first GPIO port as the first discharging duration.

Specifically, the second detecting unit 33 in this embodiment may specifically set the second GPIO port to an input state to detect a level of the capacitor, set the first GPIO port to an output low level state, so that the capacitor discharges through the fixed value resistor, and use a duration from a high level to a low level of the capacitor detected by the second GPIO port as the second discharging duration.

Specifically, the resistance obtaining unit 34 in this embodiment may calculate the resistance of R1 according to R1=R2T1/T2, where the R1 is the resistor to be tested; the R2 is the fixed value resistor; the T1 is the first discharging duration; and the T2 is the second discharging duration.

In this embodiment, a resistance obtaining unit obtains a resistance of a resistor to be tested according to a discharging duration detected by a first detecting unit for a capacitor to discharge through the resistor to be tested, a discharging duration detected by a second detecting unit for the capacitor to discharge through a fixed value resistor, and a resistance of the fixed value resistor, so that an information obtaining unit may obtain equipment identification information corresponding to the resistance of the resistor to be tested according to mapping between a resistance of a resistor to be tested and equipment identification information, so as to avoid a problem in the prior art that the number of pieces of equipment identification information that GPIO ports may identify is limited, which is caused by the fact that, a fixed number of GPIO ports may identify only a limited number of pieces of equipment identification information, thereby increasing identification efficiency of the GPIO port.

It may be clearly understood by a person skilled in the art that, for the purpose of convenient and brief description, a detailed working process of the foregoing system, apparatus, and unit may refer to the corresponding process in the foregoing method embodiments, and the details will not be described herein again.

In the several embodiments provided in the present application, it should be understood that the disclosed system, apparatus, and method may be implemented in other manners. For example, the described apparatus embodiment is merely exemplary. For example, the unit division is merely logical function division and may be divided in another manner in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit are implemented in a form of a software functional unit and sold or used as a standalone product, the integrated unit may be stored in a computer-readable storage medium. Based on such an understanding, the technical solutions of the present invention essentially, or the part contributing to the prior art, or all or a part of the technical solutions may be implemented in a form of a software product. The computer software product is stored in a storage medium, and includes several instructions for instructing a computer apparatus (which may be a personal computer, a server, or a network device) to perform all or a part of the steps of the methods described in the embodiments of the present invention. The foregoing storage medium includes: any medium that can store program codes, such as a USB flash disk, a removable hard disk, a read-only memory (Read-Only Memory, ROM), a random access memory (Random Access Memory, RAM), a magnetic disk, or an optical disc.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments, or make equivalent replacements to some technical features thereof, without departing from the scope of the technical solutions of the embodiments of the present invention.

What is claimed is:

1. A method for obtaining equipment identification information, comprising:
   detecting, by using a first general purpose input output (GPIO) port, a first discharging duration for a capacitor to discharge through a resistor to be tested, wherein the first GPIO port is connected to the capacitor through a fixed value resistor;
   detecting, by using a second GPIO port, a second discharging duration for the capacitor to discharge through the fixed value resistor, wherein the second GPIO port is connected to the capacitor through the resistor to be tested;
   obtaining, according to the first discharging duration, the second discharging duration, and a resistance of the fixed value resistor, a resistance of the resistor to be tested; and
   obtaining equipment identification information corresponding to the resistance of the resistor to be tested according to mapping between a resistance of a resistor to be tested and equipment identification information;
   wherein the detecting, by using a first GPIO port, a first discharging duration for a capacitor to discharge through the resistor to be tested comprises:
   setting the first GPIO port to an input state to detect a level of the capacitor;
   setting the second GPIO port to an output low level state, so that the capacitor discharges through the resistor to be tested; and
   using a duration from a high level to a low level of the capacitor detected by the first GPIO port as the first discharging duration.

2. The method according to claim 1, further comprising:
   charging the capacitor through the first GPIO port or the second GPIO port before a discharging duration is detected.

3. The method according to claim 2, wherein the charging the capacitor through the first GPIO port or the second GPIO port comprises:
   setting the first GPIO port or the second GPIO port to an output high level state, so as to charge the capacitor through the first GPIO port or the second GPIO port.

4. The method according to claim 1, wherein the detecting, by using a second GPIO port, a second discharging duration for the capacitor to discharge through the fixed value resistor comprises:
   setting the second GPIO port to an input state to detect a level of the capacitor;
   setting the first GPIO port to an output low level state, so that the capacitor discharges through the fixed value resistor; and
   using a duration from a high level to a low level of the capacitor detected by the second GPIO port as the second discharging duration.

5. The method according to claim 1, wherein the obtaining a resistance of the resistor to be tested according to the first discharging duration, the second discharging duration, and the resistance of the fixed value resistor comprises:
   calculating the resistance of R1 according to $R1=R2T1/T2$, wherein the R1 is the resistor to be tested; the R2 is the fixed value resistor; the T1 is the first discharging duration; and the T2 is the second discharging duration.

6. The method according to claim 2, wherein the detecting, by using a first GPIO port, a first discharging duration for a capacitor to discharge through the resistor to be tested comprises:
   setting the first GPIO port to an input state to detect a level of the capacitor;
   setting the second GPIO port to an output low level state, so that the capacitor discharges through the resistor to be tested; and
   using a duration from a high level to a low level of the capacitor detected by the first GPIO port as the first discharging duration.

7. The method according to claim 2, wherein the detecting, by using a second GPIO port, a second discharging duration for the capacitor to discharge through the fixed value resistor comprises:
   setting the second GPIO port to an input state to detect a level of the capacitor;
   setting the first GPIO port to an output low level state, so that the capacitor discharges through the fixed value resistor; and
   using a duration from a high level to a low level of the capacitor detected by the second GPIO port as the second discharging duration.

8. The method according to claim 2, wherein the obtaining a resistance of the resistor to be tested according to the first discharging duration, the second discharging duration, and the resistance of the fixed value resistor comprises:
   calculating the resistance of R1 according to $R1=R2T1/T2$, wherein the R1 is the resistor to be tested; the R2 is the fixed value resistor; the T1 is the first discharging duration; and the T2 is the second discharging duration.

9. The method according to claim 3, wherein the detecting, by using a first GPIO port, a first discharging duration for a capacitor to discharge through the resistor to be tested comprises:
   setting the first GPIO port to an input state to detect a level of the capacitor;
   setting the second GPIO port to an output low level state, so that the capacitor discharges through the resistor to be tested; and
   using a duration from a high level to a low level of the capacitor detected by the first GPIO port as the first discharging duration.

10. The method according to claim 3, wherein the detecting, by using a second GPIO port, a second discharging duration for the capacitor to discharge through the fixed value resistor comprises:
    setting the second GPIO port to an input state to detect a level of the capacitor;
    setting the first GPIO port to an output low level state, so that the capacitor discharges through the fixed value resistor; and using a duration from a high level to a low level of the capacitor detected by the second GPIO port as the second discharging duration.

11. The method according to claim 3, wherein the obtaining a resistance of the resistor to be tested according to the first discharging duration, the second discharging duration, and the resistance of the fixed value resistor comprises:
calculating the resistance of R1 according to R1=R2T1/T2, wherein the R1 is the resistor to be tested; the R2 is the fixed value resistor; the T1 is the first discharging duration; and the T2 is the second discharging duration.

12. An apparatus for obtaining equipment identification information, comprising:
a first detecting unit, configured to detect, by using a first general purpose input output GPIO port, a first discharging duration for a capacitor to discharge through a resistor to be tested, wherein the first GPIO port is connected to the capacitor through a fixed value resistor;
a second detecting unit, configured to detect, by using a second GPIO port, a second discharging duration for the capacitor to discharge through the fixed value resistor, wherein the second GPIO port is connected to the capacitor through the resistor to be tested;
a resistance obtaining unit, configured to obtain, according to the first discharging duration, the second discharging duration, and a resistance of the fixed value resistor, a resistance of the resistor to be tested; and
an information obtaining unit, configured to obtain equipment identification information corresponding to the resistance of the resistor to be tested according to mapping between a resistance of a resistor to be tested and equipment identification information:,
wherein the first detecting unit is configured to:
set the first GPIO port to an input state to detect a level of the capacitor, set the second GPIO port to an output low level state so that the capacitor discharges through the resistor to be tested, and use a duration from a high level to a low level of the capacitor detected by the first GPIO port as the first discharging duration.

13. The apparatus according to claim 12, further comprising a capacitor charging unit, configured to charge the capacitor through the first GPIO port or the second GPIO port.

14. The apparatus according to claim 13, wherein the capacitor charging unit is configured to set the first GPIO port or the second GPIO port to an output high level state, so as to charge the capacitor through the first GPIO port or the second GPIO port.

15. The apparatus according to claim 12, wherein the second detecting unit is configured to
set the second GPIO port to an input state to detect a level of the capacitor, set the first GPIO port to an output low level state, so that the capacitor discharges through the fixed value resistor, and use a duration from a high level to a low level of the capacitor detected by the second GPIO port as the second discharging duration.

16. The apparatus according to claim 12, wherein the resistance obtaining unit is configured to
calculate the resistance of R1 according to R1=R2T1/T2, wherein the R1 is the resistor to be tested; the R2 is the fixed value resistor; the T1 is the first discharging duration; and the T2 is the second discharging duration.

17. The apparatus according to claim 14, wherein the first detecting unit is configured to
set the first GPIO port to an input state to detect a level of the capacitor, set the second GPIO port to an output low level state so that the capacitor discharges through the resistor to be tested, and use a duration from a high level to a low level of the capacitor detected by the first GPIO port as the first discharging duration.

18. The apparatus according to claim 14, wherein the second detecting unit is configured to
set the second GPIO port to an input state to detect a level of the capacitor, set the first GPIO port to an output low level state, so that the capacitor discharges through the fixed value resistor, and use a duration from a high level to a low level of the capacitor detected by the second GPIO port as the second discharging duration.

\* \* \* \* \*